(12) United States Patent
Wargo (10) Patent No.: US 6,257,320 B1
(45) Date of Patent: Jul. 10, 2001

(54) HEAT SINK DEVICE FOR POWER SEMICONDUCTORS

(76) Inventor: Alec Wargo, 1058 Rubber Ave., Naugatuck, CT (US) 06770

( * ) Notice: Subject to any disclaimer, the term of this patent is extended or adjusted under 35 U.S.C. 154(b) by 0 days.

(21) Appl. No.: 09/536,589

(22) Filed: Mar. 28, 2000

(51) Int. Cl.[7] ...................................................... F28F 7/00
(52) U.S. Cl. ........................ 165/80.4; 165/104.33; 174/15.1; 257/714; 361/699; 361/709
(58) Field of Search .............. 165/80.4, 104.33, 165/185, 80.3; 361/709, 699, 689, 677; 174/15.1; 257/714

(56) References Cited

U.S. PATENT DOCUMENTS

| | | |
|---|---|---|
| 3,361,195 | 1/1968 | Meyerhoff et al. . |
| 4,612,978 * | 9/1986 | Cutchaw ........................ 165/104.33 |
| 5,016,090 * | 5/1991 | Galyon et al. ....................... 165/80.4 |
| 5,079,619 * | 1/1992 | Davidson ............................... 361/699 |
| 5,099,311 * | 3/1992 | Bonde et al. ......................... 165/80.4 |
| 5,146,314 * | 9/1992 | Pankove ............................... 165/80.4 |
| 5,179,500 * | 1/1993 | Koubek et al. ................. 165/104.33 |
| 5,731,954 * | 3/1998 | Cheon .................................... 361/699 |
| 5,763,951 * | 6/1998 | Hamilton et al. ..................... 257/714 |
| 5,764,483 * | 6/1998 | Ohashi et al. ......................... 361/699 |
| 5,901,037 * | 5/1999 | Hamilton et al. ..................... 165/80.4 |
| 6,029,742 * | 2/2000 | Burward-Hoy ....................... 165/80.4 |

\* cited by examiner

Primary Examiner—Ira S. Lazarus
Assistant Examiner—Terrell McKinnon
(74) Attorney, Agent, or Firm—Bachman & LaPointe, P.C.

(57) ABSTRACT

A fluid cooled heat sink device suitable for use with a semiconductor especially in high power systems including a heat sink member having a plurality of interior walls defining a plurality of passageways for a cooling fluid, with the heat sink member having an essentially flat surface and with the passageways being in heat exchange relationship with the flat surface. The passageways define a plurality of paths for cooling fluid with wide channel areas adjacent the flat surface.

20 Claims, 7 Drawing Sheets

HEAT SINK DEVICE FOR POWER SEMICONDUCTORS

The present invention relates to a fluid cooled heat sink device for use with a semiconductor devices particularly in high power systems. As shown in the instant specification, the cooling device is applied to a high powered, flat base insulated gate bipolar transistor (IGBT) module, but is not limited to this component or package type.

It is necessary to efficiently remove heat in order to limit temperature rise, to achieve the maximum current carrying and switching capability in high power semiconductor devices. This is particularly true in ultra high power systems where individual semiconductor devices must dissipate upwards to 1500–4000 watts and more without overheating.

Moreover, it is highly desirable to accomplish this in a simple, convenient and expeditious manner suitable for efficiently cooling such ultra high power systems without the use of massive cooling devices.

It is therefore a principal object of the present invention to provide a fluid cooled heat sink device suitable for use with power semiconductors.

It is a further object of the present invention to provide a device as aforesaid which is suitable for use in ultra high power systems where individual semiconductor devices must dissipate upwards of 1500–4000 watts and more without overheating.

It is a still further object of the present invention to provide a device as aforesaid which accomplishes the foregoing in a simple, convenient and expeditious manner without the use of massive cooling devices.

Further objects and advantages of the present invention will appear hereinbelow.

SUMMARY OF THE INVENTION

In accordance with the present invention, it has been found that the foregoing objects and advantages are readily obtained.

The present invention provides a fluid cooled heat sink device suitable for use with a semiconductor, which comprises: a heat sink member having a plurality of interior walls defining a plurality of passageways for a cooling fluid; said heat sink member having a heat exchange surface and said passageways defining a plurality of channel areas in heat exchange relationship with said surface; wherein said passageways define a plurality of paths for cooling fluid with wide channel areas adjacent said surface; and means for introducing cooling fluid into said passageways.

Desirably, the passageways define a plurality of tortuous paths, and desirably the heat sink member has an essentially flat heat exchange surface.

In the preferred embodiment, the heat sink member includes a plurality of overlapping pockets with channel areas adjacent said surface. The pockets may, for example, be essentially round, square, oval, triangular, rectangular, etc. Also, preferably the overlapping areas represent only a portion of the diameter of the channel areas.

In a preferred embodiment, means are provided to create turbulent flow in the passageways. For example, the overlapping areas represent narrow passageways which cause cooling fluid to impinge on the channel and wall areas with turbulence.

Further features of and advantages of the present invention will appear hereinbelow.

BRIEF DESCRIPTION OF THE DRAWINGS

The present invention will be more readily understandable from a consideration of the accompanying exemplificative drawings, in which.

DETAILED DESCRIPTION OF PREFERRED EMBODIMENTS

The present invention provides a high performance fluid cooled heat sink for flat base or capsule semiconductor packages for use in ultra high power systems where individual semiconductor devices must dissipate upwards of 1500–4000 watts and more without failure due to overheating. The present invention provides a heat sink member having a heat exchange surface, a plurality of interior walls defining a plurality of passageways for a cooling fluid, as water, with the passageways defining a plurality of channel areas in heat exchange relationship with the heat exchange surface. The passageways define a plurality of paths for the cooling fluid with wide channel areas adjacent the desirably flat surface.

The present invention preferably provides a tortuous path for coolant flow which increases turbulence to enhance coolant contact with the heat transfer surface. This assists in reducing the boundary layer effect of stagnant cooling medium near the heat transfer surface acting in an insulating manner to impede heat transfer. In addition, the present device effectively utilizes an impingement mode of cooling whereby the coolant is caused to be sprayed essentially perpendicularly against the heat transfer surfaces at least partially by velocity port effect to essentially eliminate the boundary layer effect. Further, the present device provides an extended surface area of heat transfer surface in contact with the cooling medium to enhance cooling while still promoting the mechanical strength to support the semiconductor device mechanically and effectively contain the high coolant flows and pressure.

The present invention effectively uses large and shallow annular cooling pockets and coolant flow as a wide, thin, flat web-like flow through multiple parallel paths thereby providing effective short heat absorption paths to give high coolant contact area volume with heat transfer surfaces, for high heat absorption for rapid and efficient heat removal. Still further, the present invention accomplishes the foregoing in the difficult high power systems without the use of massive cooling devices and in fact minimizes the thickness of the heat transfer body to provide a short and extremely efficient heat flow path from the semiconductor to coolant, while still maintaining the integrity of a discrete, sealed coolant chamber to eliminate the likelihood of catistrophic failures due to leaks, corrosion, electrolysis, electrochemical attack of semiconductor base, flexing and facture of silicon wafer due to pressure surges of coolant, and poor transient thermal imperance, all characteristic flaws of cooling devices where the semiconductor base directly contacts coolant, and the semiconductor base is used to create a water tight seal.

Figure 1:
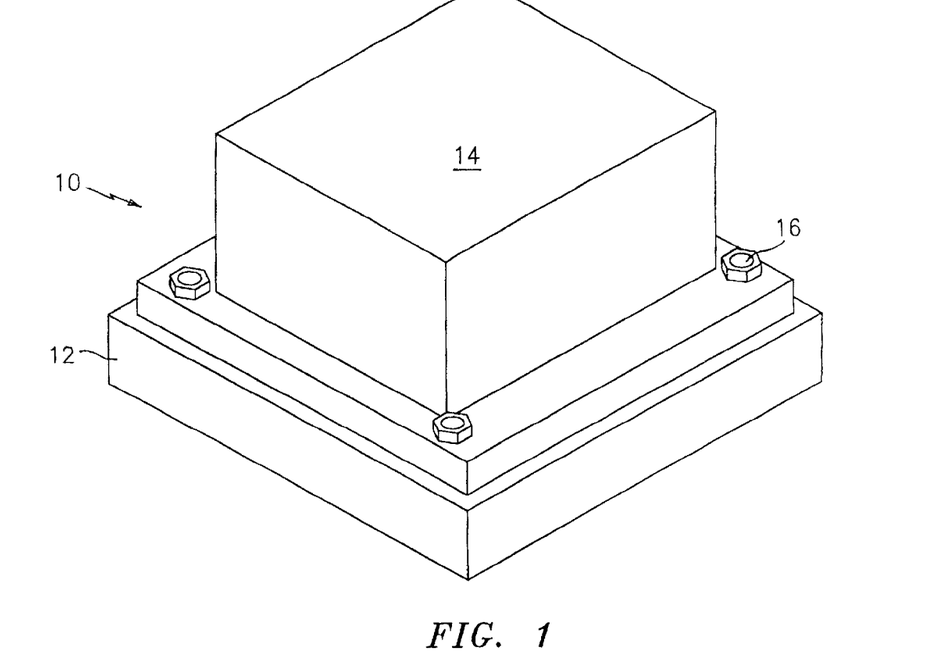
FIG. 1 is a perspective view of an assembly of the heat sink device and a semiconductor.
Figure 2:
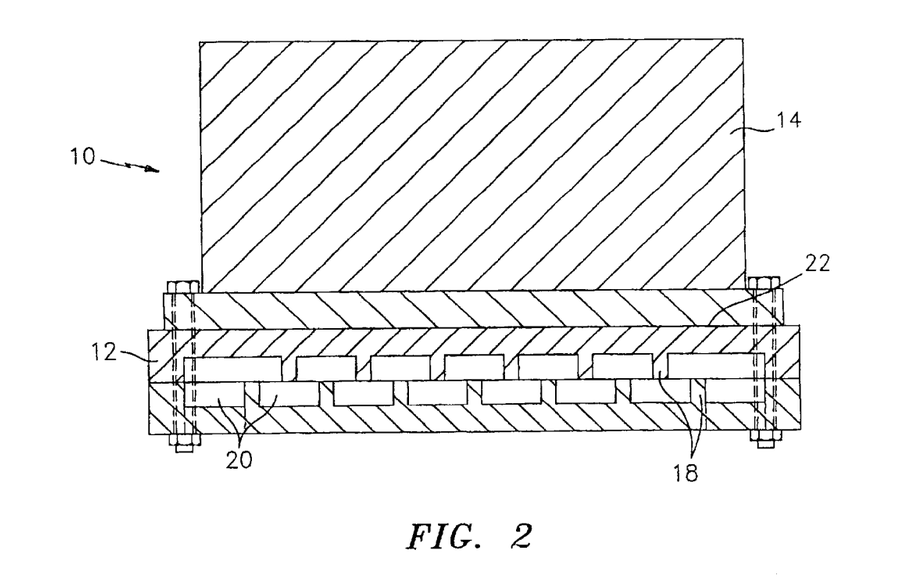
FIG. 2 is a sectional view of the assembly of FIG. 1.

With reference to the drawings, FIG. 1 shows an assembly 10 of a heat sink member 12 with a semiconductor 14 affixed thereto as by screws 16. The semiconductor is for use in ultra high power systems as discussed hereinabove. FIG. 2 shows a sectional view of the assembly of FIG. 1, with the heat sink member having a plurality of interior walls 18 defining a plurality of internal passageways 20 for a cooling fluid. The heat sink member 12 has a heat exchange surface 22, generally a flat surface, and the passageways 20 define a plurality of channel areas in heat exchange relationship with the surface 22. The semiconductor 14 is affixed to surface 22 so that the semiconductor is in direct heat exchange relationship therewith. It is feasible to have direct contact between coolant and the semiconductor, but this is not preferred due to likely failure of the semiconductor, and system as noted above.

Figure 3:
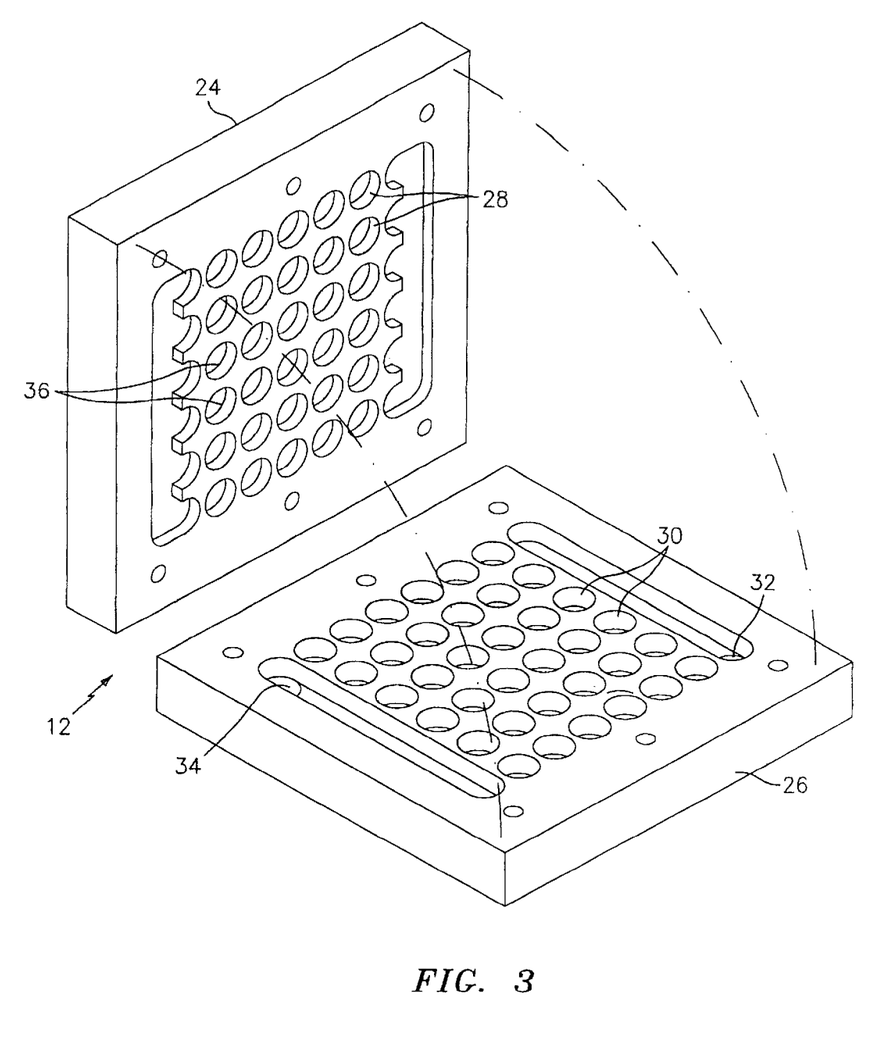
FIG. 3 is a perspective view of a representative embodiment of components of the heat sink device of the present invention spaced apart.

In the preferred embodiment shown in FIG. 3, the heat sink member 12 includes two portions, an upper portion 24 and a lower portion 26, which are affixed together by any desired means. Naturally, a single piece heat sink member may be used or more than two portions may be used. The passageways 20 are partly formed in each of the upper and lower portions, with upper passageways 28 formed in the upper portion 24 and lower passageways 30 formed in the lower portion 26.

Figure 4:
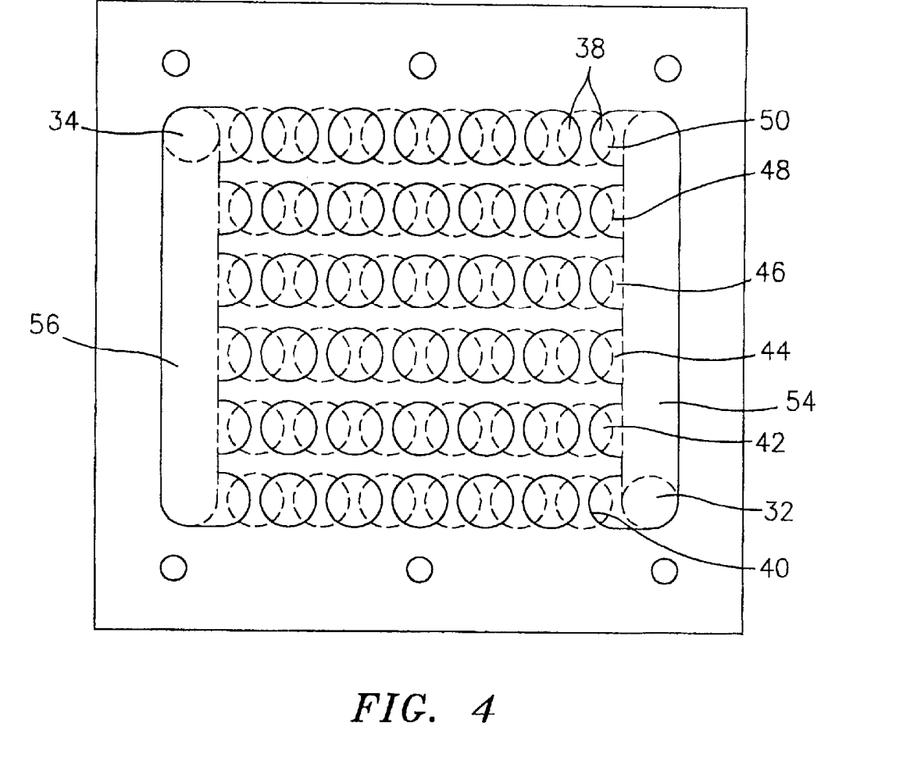
FIG. 4 is a top view through the components of FIG. 3 assembled together and showing the internal passageways.

FIG. 4 shows the assembled components with the passageways shown. Coolant fluid, desirably water but other coolants may of course be used, enters inlet 32 and exits outlet 34. Each of the upper and lower portions include a plurality of pockets 36 and in the assembled condition the pockets overlap to form overlapping areas 38. Therefore, the coolant flows sinuously from pocket to pocket connecting via the overlapping areas. In addition, the passageways 20 define a plurality of separate paths for cooling fluid, with six (6) such paths 40, 42, 44, 46, 48 and 50 shown in FIG. 4. Naturally, the number and orientation of the paths will depend on the particular application.

Figure 5:
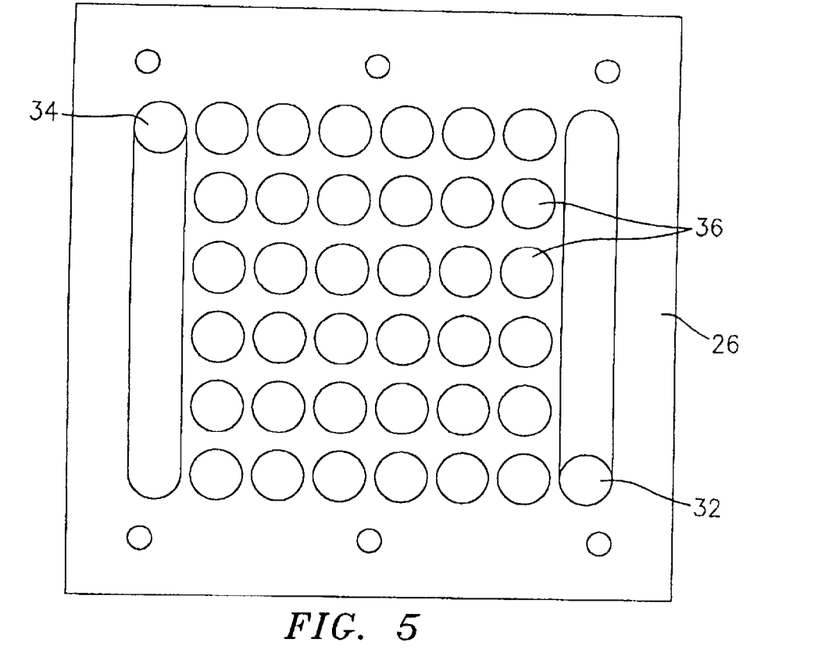
FIG. 5 is a top view of the bottom half of the components of FIG. 3.
Figure 6:
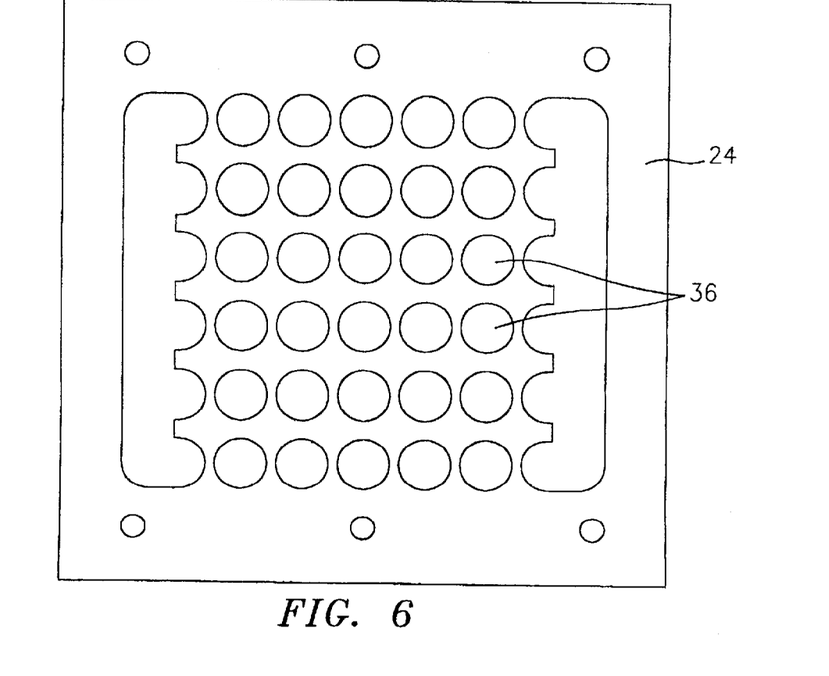
FIG. 6 is a top view of the top half of the components of FIG. 3.
Figure 7:
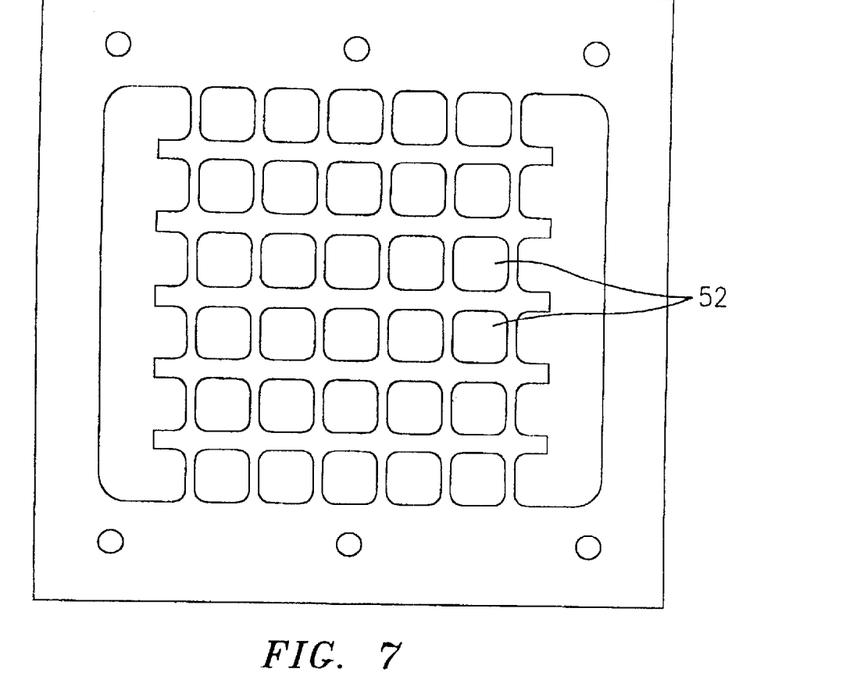
FIG. 7 is a top view of an alternate embodiment of the top half of the components of FIG. 3.

FIG. 5 is a top view of lower portion 26 and FIG. 6 is a top view of upper portion 24. The pockets 36 are shown as round in the embodiment of FIGS. 3–6, but any suitable shape may be used, such as the square pockets 52 shown in FIG. 7.

Coolant flows from the inlet 32 to inlet header 54, to the several paths 40, 42, 44, 46, 48 and 50, to outlet header 56 and to outlet 34.

Figure 8:
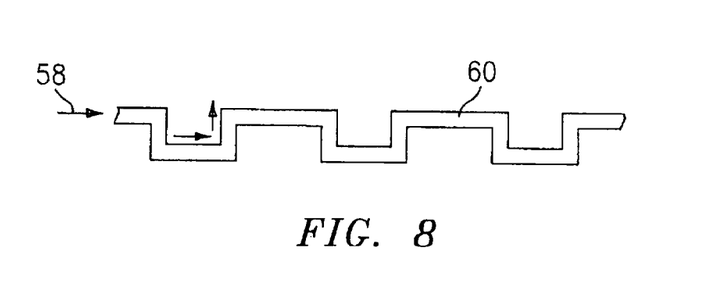
FIGS. 8 and 9 are partly schematic side and top views, respectively, of coolant flow paths in a passageway of the assembled components.
Figure 9:
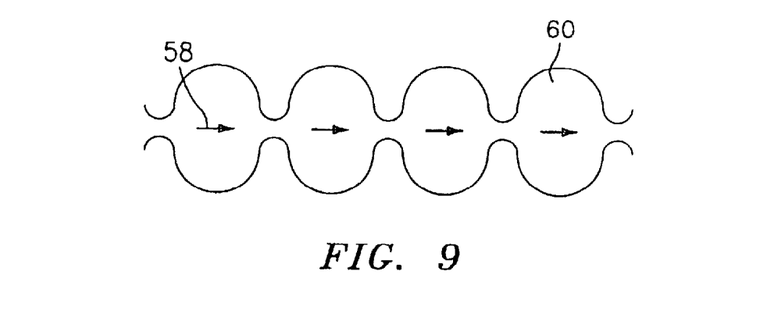

FIGS. 8 and 9 show side and top schematic views, respectively, of coolant flow paths 58 in a passageways of the assembled components. It can be seen that wide, flat channel areas 60 are provided by the pockets in the upper heat sink portion adjacent the flat heat exchange surface 22 for efficient heat exchange relationship with the heat exchange surface.

Also, a tortuous path is provided for coolant flow. As can be clearly seen in FIG. 4, the overlapping areas 38 represent only a portion of the diameter of the flat channel areas 60. The narrow area of overlap 38 between upper passageways 28 and lower passageways 30 creates velocity of fluid flow and turbulence within the passageways due to fluid velocity. Fluid flow within the passageways impinges on the upper wall surface 22 and promotes efficient heat transfer by minimizing dead spots. The dimensions of the overlap would depend on variables, such as desired flow rate, pressure drop and cooling fluid.

Also, the pocket layout will be dependent on the dimensions and shape of the semiconductor. The pockets should desirably fall generally within the area of the semiconductor. Also, the area of overlap is naturally variable depending on desired results, but the area of overlap generally corresponds approximately to the passageway depth as shown in FIG. 8.

Figure 10:
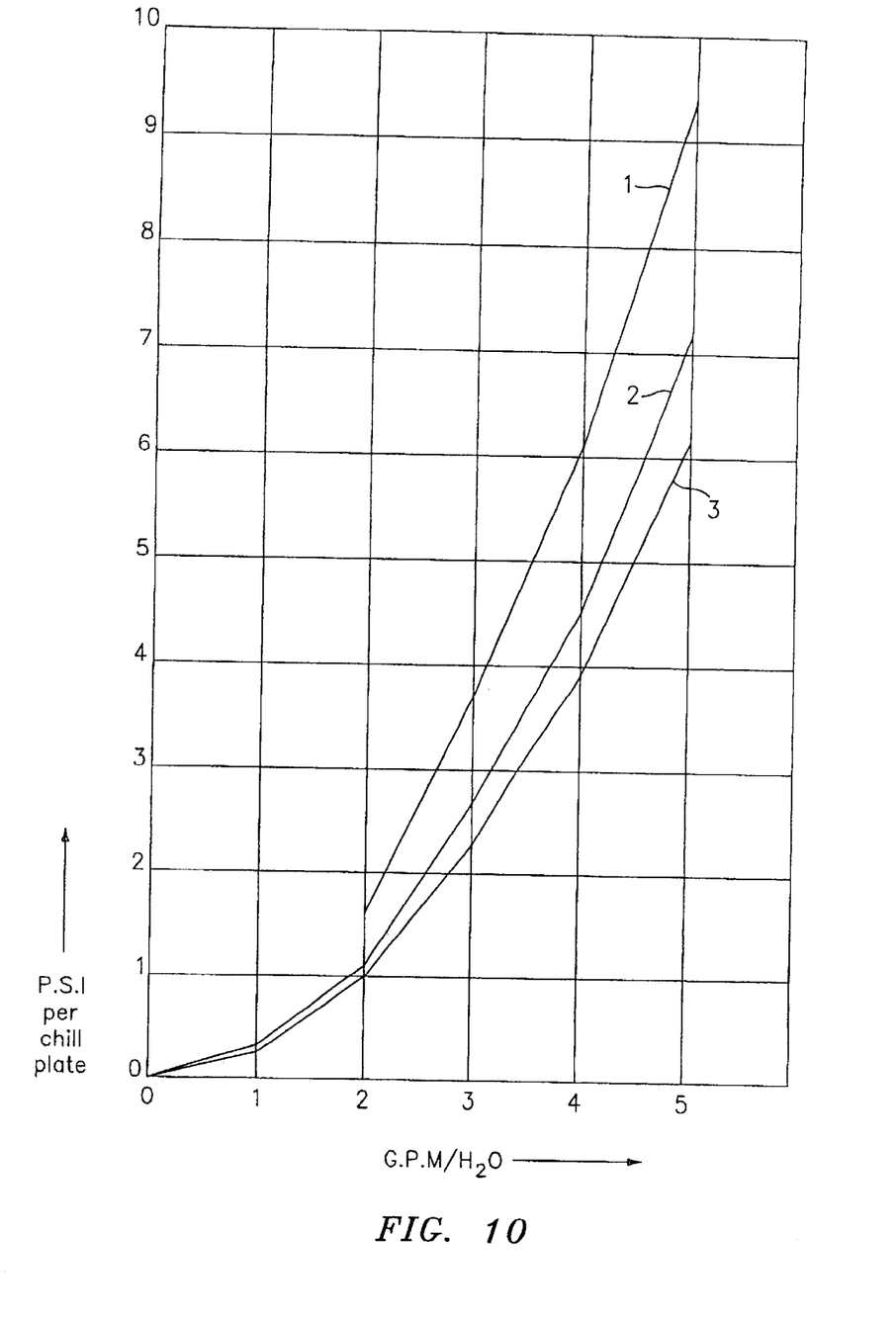
FIGS. 10 and 11 are graphs showing, respectively, pressure drop versus water flow and temperature reduction of a semiconductor versus water flow.

FIG. 10 is a graph showing pressure drop for a given water flow in gallons per minute per unit. Lines 1 and 2 show one-half inch round pockets as in FIGS. 3–6, and line 3 shows one-half inch square pockets as in FIG. 7. FIG. 10 shows that the practical water flow for these units is 2–5 gallons per minute. Naturally, other unit configurations will give different results.

Figure 11:
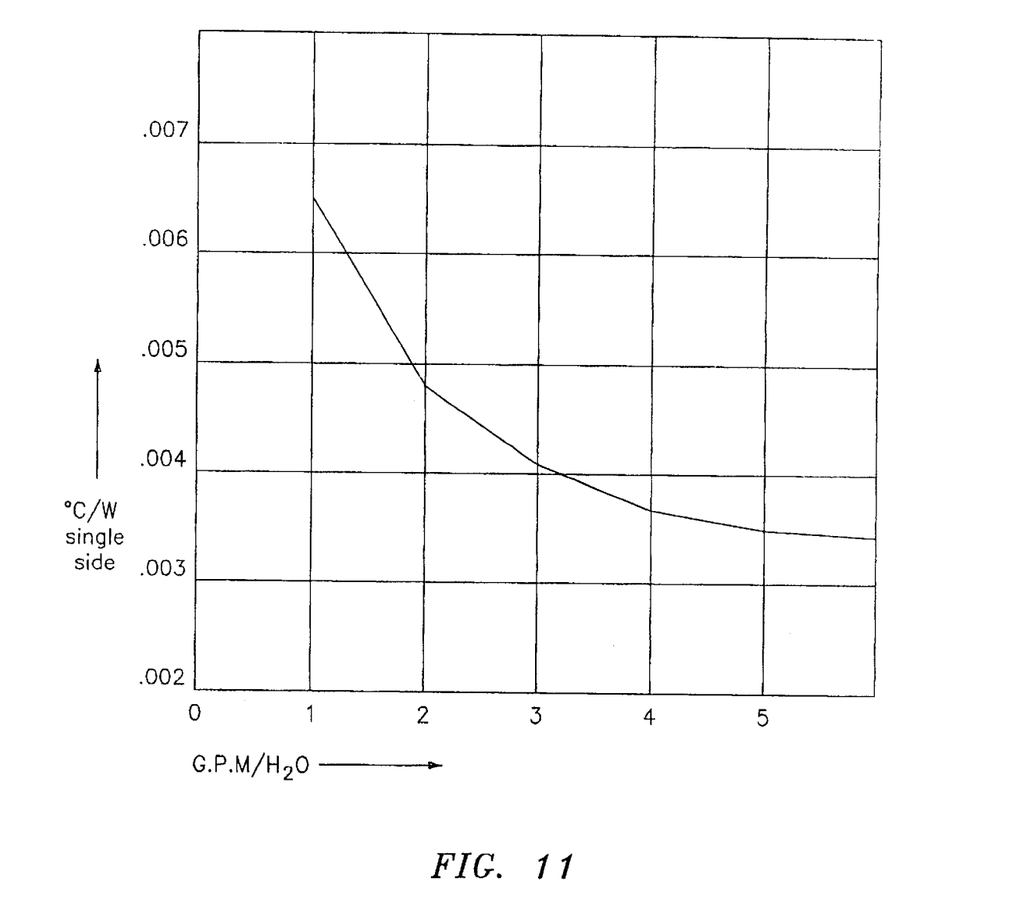

FIG. 11 shows temperature reductions in degrees centigrade per watt based on water flow in gallons per minute for a unit corresponding to FIGS. 3–6 with one-half inch round pockets. Thus, referring to FIG. 11, the line labeled "0.004", if a semiconductor would generate 2000 watts, one would multiply 2000 by 0.004 with the result of a temperature increase of 8° C. FIG. 11 shows that for the given test with the particular unit tested effective cooling occurs at a water flow of 2–5 gallons per minute.

The embodiments shown herein depict cooling on one side of the heat sink member. Naturally, one could cool on two sides if desired.

The cooling device and assembled units of the present invention are of simple and straightforward construction. They are desirably constructed of two or more sections which may be cast, forged or machined, for example. They can be assembled in a sandwich type manner and bonded together by any suitable means as by adhesive, silver solder, brazing, welding and the like and/or screwed or bolted together. A one piece casting may also be employed which may for example be produced from various thermally conductive materials. In the construction of the present invention, however, copper is the most preferred material especially when the cooling medium is a water based cooling medium.

In the preferred embodiments for water based applications desired for flow rates of 2–7 gallons per minute, pocket diameters of 7/16" to 11/16" are preferred, with preferred pocket depths of 0.175 to 0.25", naturally dependent upon desired flow rates and acceptable pressure drops. The interface wall thickness adjacent the semiconductor is preferably from 0.05 to 0.2", dependent on fluid pressures, mounting pressures and possibly electric current levels. Naturally, other ranges of all of these components may be suitably employed depending upon desired results.

It is to be understood that the invention is not limited to the illustrations described and shown herein, which are deemed to be merely illustrative of the best modes of carrying out the invention, and which are susceptible of modification of form, size, arrangement of parts and details of operation. The invention rather is intended to encompass all such modifications which are within its spirit and scope as defined by the claims.

What is claimed is:

1. A fluid cooled heat sink device suitable for use with a semiconductor, which comprises:

a heat sink member having a plurality of interior walls defining a plurality of passageways for a cooling fluid;

said heat sink member having a heat exchange surface and said passageways defining a plurality of channel areas in heat exchange relationship with said surface;

wherein said passageways define a plurality of paths for cooling fluid with wide channel areas adjacent said surface;

means for introducing cooling fluid into said passageways; and wherein said heat sink member includes a plurality of shallow overlapping pockets with essentially flat channel areas adjacent said heat exchange surface, to provide a unidirectional cooling fluid flow within each passageway and with a tortuous cooling fluid flow through the heat sink member, with the cooling fluid impinging on substantially the entire flat channel areas adjacent said heat exchange surface.

2. A device according to claim 1, wherein the overlapping areas represent a portion of the diameter of the flat channel areas.

3. A device according to claim 1, wherein the pockets are essentially round.

4. A device according to claim 1, wherein the pockets are essentially square.

5. A device according to claim 1, including an inlet channel communicating with said means for introducing cooling fluid, with said inlet channel contacting a plurality of said pockets, and an outlet channel contacting a plurality of said pockets and communicating with a means for transferring cooling fluid out of said passageways.

6. A device according to claim 1, including a wall between the flat surface of the heat sink member and the passageways.

7. A device according to claim 1, wherein the heat sink member includes at least two pieces connected together.

8. A device according to claim 1, wherein the heat sink member is a single member.

9. A device according to claim 1, including means to create turbulent flow in said passageways.

10. A device according to claim 1, wherein said overlapping pockets define passageways which cause cooling fluid to impinge on the flat channel areas with turbulence.

11. A device according to claim 1, including a semiconductor element to be cooled on the heat exchange surface of the heat sink member.

12. A device according to claim 11, wherein said passageways are within the areas of the semiconductor element.

13. A device according to claim 9, including means to cause coolant to spray against said channel areas.

14. A device according to claim 1, wherein said passageways define separate paths for cooling fluid.

15. A device according to claim 1, wherein said passageways define a sinuous path for coolant flow.

16. A device according to claim 1, including pocket diameters of 7/16" to 11/16" and pocket depths of 0.175" to 0.25" for coolant flow rates of 2 to 7 gallons per minute.

17. A device according to claim 6, wherein said wall is from 0.05" to 0.2" in thickness.

18. A device according to claim 1, wherein said wall is up to 0.2" in thickness.

19. A device according to claim 1, with essentially horizontal coolant flow in said flat channel areas adjacent said heat exchange surface.

20. A device according to claim 19, including essentially vertical cooling fluid flow between said pockets.

* * * * *